United States Patent [19]

Hoffman et al.

[11] Patent Number: 4,481,566
[45] Date of Patent: Nov. 6, 1984

[54] ON CHIP CHARGE TRAP COMPENSATED HIGH VOLTAGE CONVERTER

[75] Inventors: Charles R. Hoffman, Raleigh; Geoffrey B. Stephens, Cary, both of N.C.

[73] Assignee: International Business Machines Corporation, Armonk, N.Y.

[21] Appl. No.: 481,682

[22] Filed: Apr. 4, 1983

[51] Int. Cl.³ .............................................. H02M 3/18
[52] U.S. Cl. ....................................... 363/60; 307/491
[58] Field of Search .............................. 363/60, 61, 68; 307/246, 491, 494, 497

[56] References Cited

U.S. PATENT DOCUMENTS

| | | | |
|---|---|---|---|
| 4,186,436 | 1/1980 | Ishiwatari | 363/60 |
| 4,281,377 | 7/1981 | Evans | 363/60 X |
| 4,302,804 | 11/1981 | Bader | 363/60 |
| 4,321,661 | 3/1982 | Sano | 363/60 |
| 4,398,099 | 8/1983 | Benoit-Gonin et al. | 363/60 X |

*Primary Examiner*—Peter S. Wong

*Attorney, Agent, or Firm*—Edward H. Duffield

[57] ABSTRACT

The invention is an improved on chip low voltage to high voltage converter. A capacitive charge pump circuit driven by an asynchronous inverter is used. The charge pump has improved voltage regulation that automatically compensates for process variation in the required program/erase voltage and for charge trapping in the oxide layer of electrically alterable memory products. A charge trapping material that tracks the charge trapping occurring in memory products is used in a feedback circuit to control the output voltage supply. As charge trapping occurs, the output supply voltage is boosted. This overcomes the effects of charge trapping and provides increased cycles of writing and erasing for a semiconductor memory that suffers from charge trapping in its oxide insulation. A dual electron injector structure is used to monitor the charge trapping effect. A typical one order magnitude increase in the number of write or erase cycles before memory degradation occurs can be achieved with this invention.

3 Claims, 10 Drawing Figures

ON CHIP CHARGE TRAP COMPENSATED HIGH VOLTAGE CONVERTER

FIELD OF THE INVENTION

This invention relates to electrically alterable high density memory circuits and devices in general and specifically to electrically alterable silicon semiconductor integrated circuit devices and to charge pump operated high voltage converters for converting logic level voltage to high voltage necessary for writing or erasing the memory cells.

PRIOR ART

General charge pump circuits for on chip application are known. These are used primarily to generate the high voltages required for writing or erasing electrically alterable or programmable floating gate semiconductor memory circuits. One such charge pump circuit has been described in "On Chip High Voltage Generation in MNOS Integrated Circuits Using an Improved Voltage Multiplier Technique" appearing in IEEE JSSC, Vol. SC-11, No. 3, June, 1976, pgs. 374–379. However, several shortcomings exist with this known type of circuit.

First, the highest voltage attainable at the output of the circuit is limited by the voltage handling capabilities of the semiconductor technology employed. For present day technology, the limitation presented restricts the upper limit of voltages to less than the level needed for the charge transfer operations in floating gate memory devices. Secondly, an output voltage constraint in the prior art is dependent upon the low voltage device characteristics and does not depend upon tunneling path parameters in the memory device. Output voltage control utilizing low voltage device characteristics do not accurately reflect the changing characteristics of the programmable devices because the tunneling path parameters are not involved in the control circuit. Thirdly, over voltage conditions are prevented in the prior art by shunting excessive charge to ground through an output limiting circuit. Thus, the charge pump circuit must operate at maximum capacity at all times with more or less of the excess capacity shunted to ground. Additionally, variations in the tunneling path parameters of the memory elements on the chip that are due to process tolerances and variations are not compensated for by the voltage converter in the known prior art. This is because the voltage converter is not built to the same parameters and does not employ the same technologies in its operation.

OBJECTS OF THE INVENTION

In view of the foregoing known deficiencies in the prior art, it is an object of the present invention to provide an improved high voltage converter suitable for electrically alterable memory circuit applications and for integration on the same chip therewith.

A further object is to provide an improved high voltage charge pump circuit having an improved feedback path incorporating elements that track the tunneling path parameter variation that results from cyclic operation of the memory cells themselves.

SUMMARY

The foregoing and still other objects not specifically enumerated are met by providing an improved feedback and charge trap monitoring element in the high voltage converter circuit. Feedback from the output voltage is directed through a circuit element that includes a charge trapping oxide layer that mirrors the effects of alternating read and write cycles on the memory cells and changes its parameters in parallel therewith. This device is incorporated in the charge pump control circuitry so that as charge trapping in the memory cells increases, increased voltage supply for effective writing and erasing is produced. Also, the gates of the charge pump line drivers are driven by the charge pump control circuitry and are not tied to the output voltage as was done in the prior art. Thus, as the output voltage is pumped to a level greater than the predetermined level set in the monitor circuit, the voltage at the gates will be decreased due to the combined charge pump control circuit operation and the monitor circuit so that the voltage at the gates will decrease and will prevent further output voltage increases. Thus, the output voltage is regulated and the charge pump is not overdriven as it was in the prior art circuits. In addition, the charge pump monitor circuit utilizing feedback from the output power supply compensates for the charge trapping occurring in the memory cells and increases the drive voltage as is necessary to compensate for the degredation in ease of writing and erasing the memory elements.

DETAILED SPECIFICATION

Figure 1A:
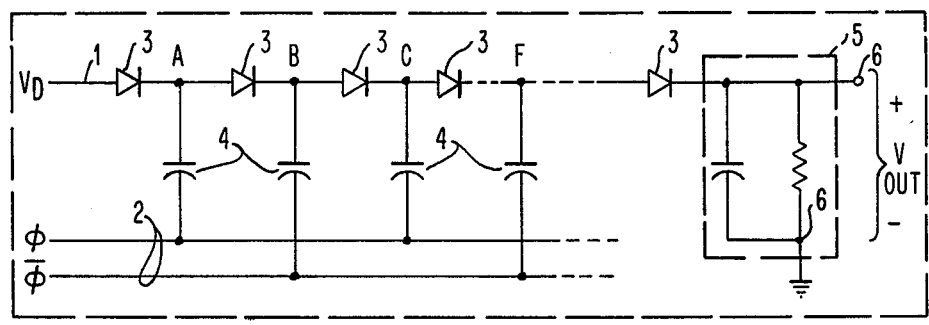
FIG. 1A schematically illustrates a generic form of an on chip charge pump high voltage power supply known in the prior art.

Turning to FIG. 1, the circuit operation for a typical high voltage on chip converter will be discussed. Each such converter is provided with a logic voltage supply 1 and two phased charging lines 2. The phases are 180° opposite and are applied on the lines 2. A series of diodes 3 with intermediate nodes connected to capacitors 4 are shown. The alternate capacitors are connected to the alternate phased supply lines 2 as shown. Each intermediate node is identified by an alphabetic letter A, B, C ... F. An output stage 5 shown in the dotted box can filter or smooth or limit the final output voltage at terminals 6.

Figure 1B:
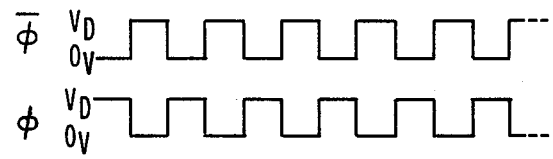
FIG. 1B illustrates the phase timing chart for pulsing of the capacitive charge pump circuit in FIG. 1A.

FIG 1B illustrates the prior art timing chart for the phase control of the lines 2 in FIG. 1A. A simple flip flop driven by an oscillator can be used to provide such a 180° out of phase timing as would be obvious to those of skill in the art.

Figure 1C:
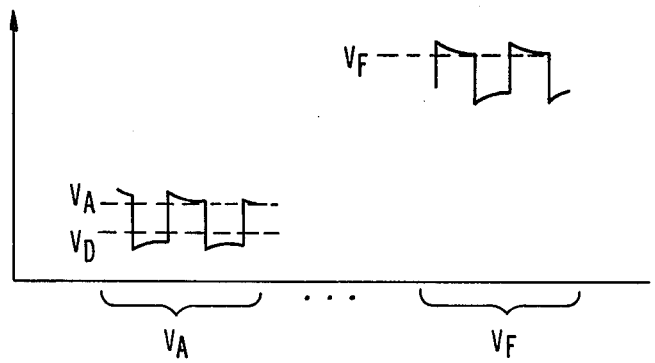
FIG. 1C illustrates an output of voltage versus charge pump stage as known in the prior art.

FIG. 1C illustrates the output of voltage at each node A, B, C, etc., when the charging lines 2 are pulsed as shown in FIG. 1B.

In operation, current flows through the first diode 3 to charge the capacitor 4 connected at point A. This charges to approximately the supply voltage on line 1 less the diode drop. Then the phase control lines 2 are alternated and node B is driven to approximately the supply voltage less two diode drops. However, the plate of capacitor 4 connected to node B has already been charged with approximately the level appearing on capacitor 4 connected to node A since diode 3 between nodes A and B was forward biased when node A was being charged. Therefore, when the voltage is increased on capacitor 4 by application of the positive voltage from the drive line 2, node B must rise up above the supply voltage on line 1. Ignoring diode drops, an approximate doubling of voltage occurs at this time. The action continues through the successive stages as the drive lines 2 are pulsed until the desired voltage increase is present at the output terminals 6.

The bootstrapping charge pump is fairly well known in the art. Of course, the output current will be relatively limited since the output current is the charge stored in the capacitor 4 at node F. A smoothing, integrating and limiting circuit in dotted box 5 consisting of a resistance and capacitance is shown schematically in FIG. 1A. It will be described in greater detail below with regard to a prior art circuit embodiment. The desired output voltage at terminal 6 may be typically a level of 18 to 25 volts for normal electrically alterable memory product and erase cycles.

Figure 2:
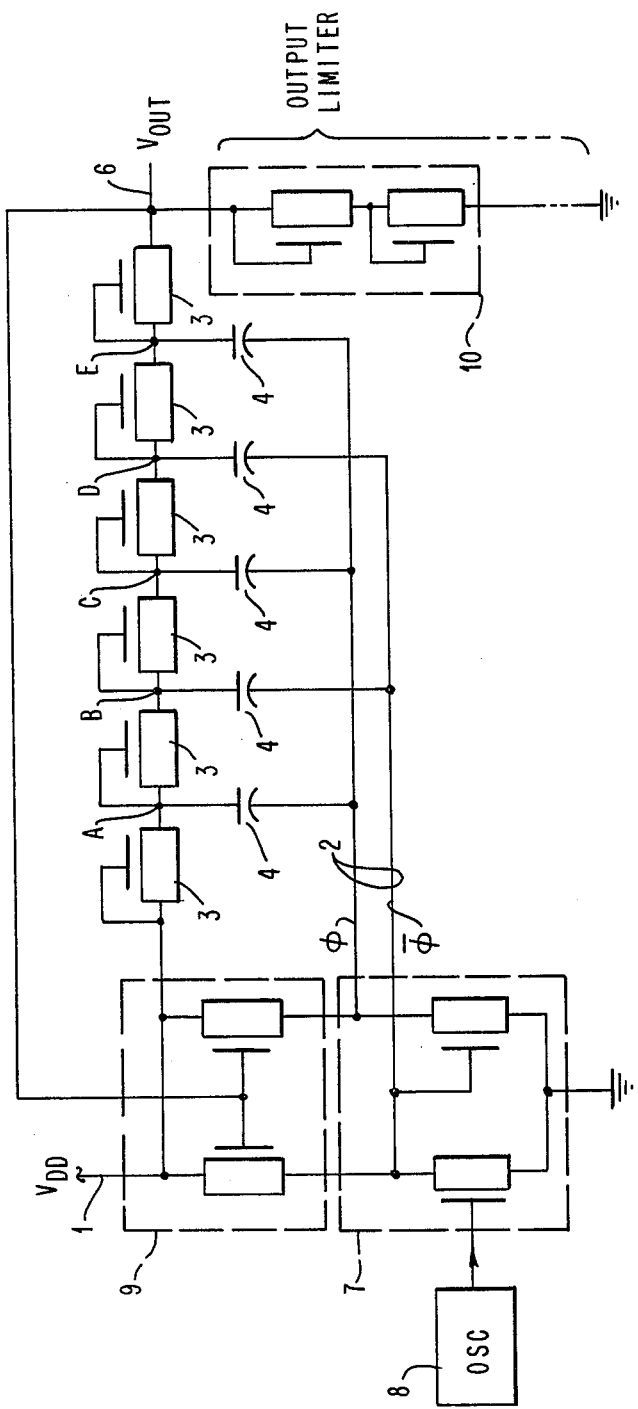
FIG. 2 illustrates a prior art charge pump circuit with the line drivers for the charge pump tied directly to the output voltage and also incorporating an output over current limiter as known in the prior art.

FIG. 2 illustrates a typical prior art charge pump circuit along the lines briefly referred to with regard to FIGS. 1A-1C. Similar numbering is used for the similar elements in FIGS. 2 and 1A. The filtering and smoothing circuit in dotted box 5 of FIG. 1A has been replaced by an output limiter in dotted box 10 and by the feedback path from output node 6 to the charge line drivers in dotted box 9. The output limiter 10 comprises a pair of series connected FETs designed to conduct once a specified output voltage has been reached. The feedback path from node 6 to the line drivers in dotted box 9 serves to operate the line drivers harder and harder as the output voltage demand is increased. A flip flop circuit in dotted box 7 is driven by the oscillator 8 to alternate the output on the two phase control lines 2 as will be apparent.

Several shortcomings exist with the circuit as shown in FIG. 2, especially when the high voltage converter is intended for use in an electrically alterable memory product. First, the highest voltage available at the output node 6 is limited by the voltage handling capability of the semiconductor circuit technology employed. For present day technologies, the upper limit is not quite sufficient for reliable operation at the higher voltages required for writing and erasing, typically 18 to 25 volts.

Secondly, the output voltage limiter such as that included in the dotted box 10 of FIG. 2 is controlled by low voltage devices and their conduction characteristics and does not depend upon tunneling path parameters present in memory cells that would be operated with the output voltage at node 6. Thus, when the memory cells suffer degredation due to the well known charge trapping effect, it would be desirable to reduce the limiting effect of circuit 10. However, there is no provision made for correcting the output voltage to accommodate for this fact. Therefore, once significant charge trapping has occurred, the output voltage supply is no longer capable of effective writing and erasing and the memory product must either be discharged, which is a cumbersome and time consuming operation done out of the circuit, or the entire memory module is simply discarded and a new one used in its place. Either event is a time consuming and expensive operation as can be readily appreciated.

Thirdly, the over voltage limit is simply a shunt to ground in the circuit included in dotted box 10. Thus the charge pump circuit itself must operate at maximum capacity at all times. This limits the available power at output node 6 since the input supplied is only the logic level voltage and current on line 1. Finally, the voltage monitor circuit in dotted box 9 does not account for parameter variations in the memory cells due to process tolerances and they are not compensated for in the voltage converter circuits. Therefore, a mismatch between the characteristics of the monitoring circuit and those of the memory cells themselves may exist due to fabrication process tolerance variations which may result in inoperable or only marginally operable products as will be appreciated by those of skill in the art.

Figure 3:
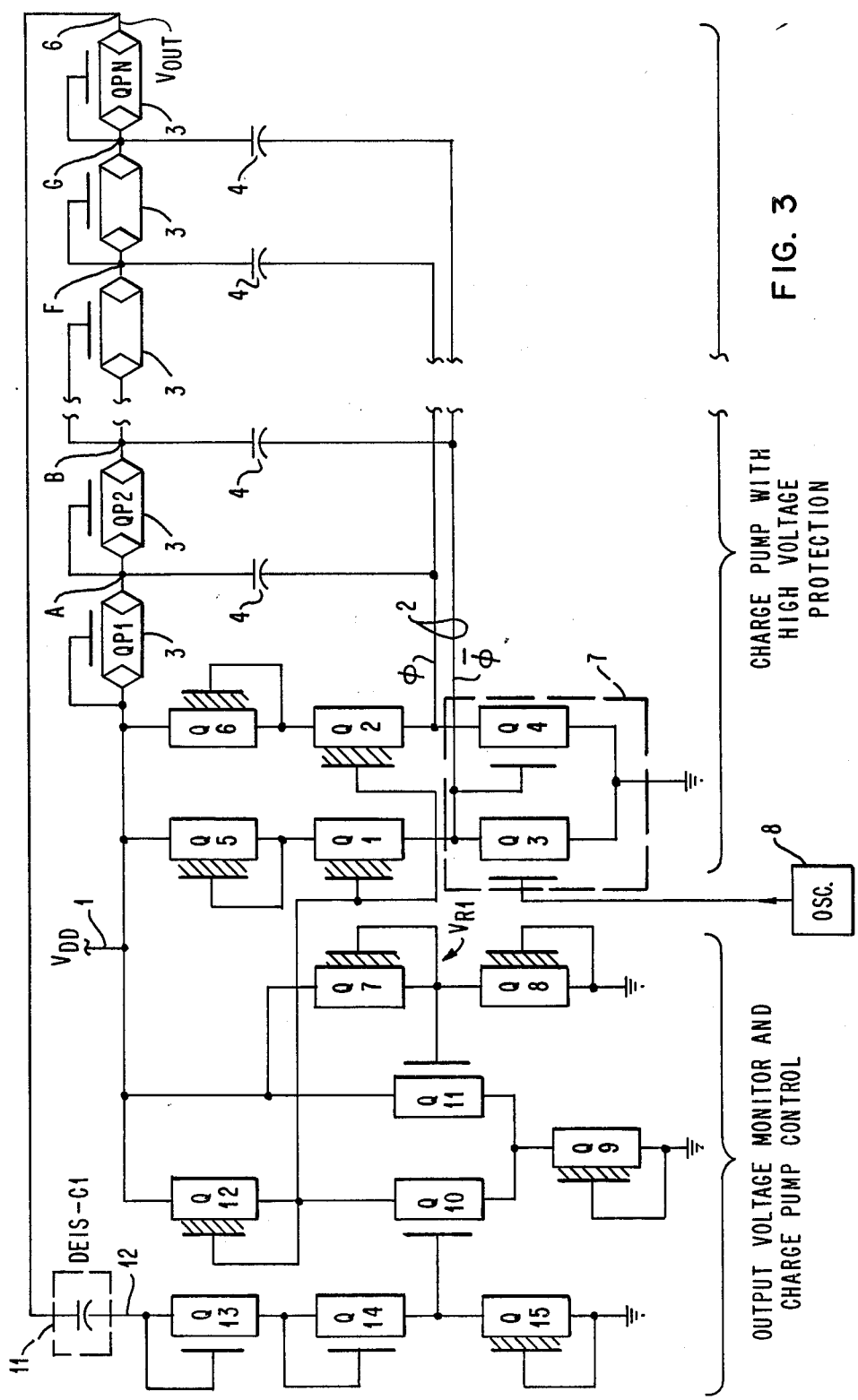
FIG. 3 is a schematic illustration of the improved charge pump circuit in a preferred embodiment of the present invention.

Turning to FIG. 3, a preferred embodiment of the present invention is shown which overcomes the foregoing problems with the known prior art. In FIG. 3, similar numbering and nomenclature is used to indicate elements of similar function or operation to those as shown in FIGS. 1 and 2. The charge pump portion is similar to that shown in FIG. 2 but with several differences. First, high voltage protection elements are incorporated at the diode junctions of the FETs 3. These will be described in greater detail later.

Secondly, the output limiter in dotted box 10 of FIG. 2 has been eliminated in FIG. 3. The output voltage is instead brought to the input terminal of an output voltage monitor circuit through a feedback circuit that includes a charge trapping monitoring device 11. Its output is supplied to node 12 which is the input to the voltage monitor circuitry. In addition, instead of tying the gates of the charge pump line drivers to the output voltage as was shown in FIG. 2, the gates of the line drivers Q1 and Q2 in FIG. 3 are driven by the charge pump control circuitry. The result of the charge pump control circuitry is that when the output voltage is raised to a level greater than the predetermined level set in the monitor circuit, the voltage at the gates will be decreased thereby preventing further output voltage increases. In this manner, the output voltage is regulated, but the charge pump is not over driven as it was for the circuit in FIG. 2.

The operation of the circuit in FIG. 3 will now be described. When the input logic voltage 1 is first applied, the oscillator 8 driving the gate of device Q3 in dotted box 7 starts rising. This in turn, drives the gate of Q4 which in turn causes the output voltage on line 2, is connected to device Q4 to rise. This is because Q3 will be conducting and the gate of Q4 will be at ground thereby allowing the source voltage from device Q2 connected to Q4 to rise. The series connected FET diodes 3 have their source and drain diffusions protected by high voltage gate protectors as will be described later. These permit the output voltage to be pumped beyond the normal technology breakdown limits for the oxide insulated semiconductor circuits employed. During the initial voltage rising time, the output voltage itself will be below the current turn on threshold of the dual electron injection structure in the feedback path shown as device 11. Therefore, the gate of device Q10 will still be at ground via Q15, a depletion mode FET with its gate tied to the ground terminal. The result of this is that the gates of devices Q1 and Q2 will be held at the logic voltage $V_{DD}$ as the charge pump is driving toward the maximum output voltage.

Devices Q7 and Q8 form a voltage divider network that establishes a reference voltage at the gate of Q11. As the output voltage on node 6 rises above the turn on threshold of the device 11, the gate of Q10 will begin to rise. Devices Q13, Q14 and Q15 are designed in such a manner that a predetermined voltage drop is established from node 12 to the gate of Q10. Once the gate of Q10 increases above the reference level, the gates of Q1 and Q2 will be pulled toward ground. This will clamp the output voltage to a predetermined level that is dependent upon the circuit design of the devices Q13, Q14, and Q15 and the reference voltage and on the characteristics of the DEIS element in the feedback path shown as device 11. The characteristics of the DEIS device 11 track the variations in tunneling path parameters in memory cell products that will be driven by the voltage supplied at node 6. In addition, the device 11 is built using the same process techniques so that parameter variations during the circuit formation process are accurately tracked in device 11 to monitor those that will occur in the memory elements built during the same stage of the same process.

The charge pump circuit in FIG. 3 is used each time a program/erase cycle is performed in a memory cell, not shown. Therefore, as charge trapping occurs and fills in sites in the oxide layer of the memory cells, they are also filled in the feedback element 11 in its dielectric. The result is that an increasing output voltage as a function of the number of cycles of operation will occur. In turn, this increases the total number of cycles that one can achieve in the electrically alterable memory cells beyond that achievable with a fixed voltage design.

Device 11 is a dual electron injector structure well known in the art. It has been described by DiMaria et al in an article entitled, "Dual Electron Injector Structure Electrically Alterable Read Only Memory Modeling Studies," appearing in IEEE Transactions on Electron Devices, Sept. 1981, pgs. 1047–1053. The structure of device 11 is shown therein and is well known to those of skill in the art. The structure consists of chemically vapor deposited silicon rich first and third layers with an intermediate sandwich layer of silicon dioxide. This entire sandwich is packed between polycrystaline silicon layers which act as contacts to the silicon rich silicon dioxide portions of the sandwich. At moderately high electric fields, the structure will conduct current while for low fields it behaves as a good insulator. When the magnitude of the driving voltage applied to such a sandwich is increased, a point is reached where electron injection occurs from the silicon rich layer through the oxide layer to the opposite side of the sandwich. The direction of injection is dependent upon the direction of the supplied voltage. Charge trapping in the intermediate silicon dioxide layer occurs in parallel with that occurring in memory products utilizing, for example, a floating gate oxide insulated structure. With repeated use, charge trapping occurs in the oxide mid layer of the sandwich. This acts as a reverse field that prevents injection until it has been exceeded by the applied field driving injection.

Figure 4A:
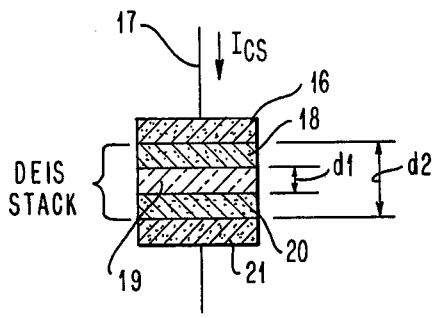
FIG. 4A illustrates the prior art DEIS stack.
Figure 4B:
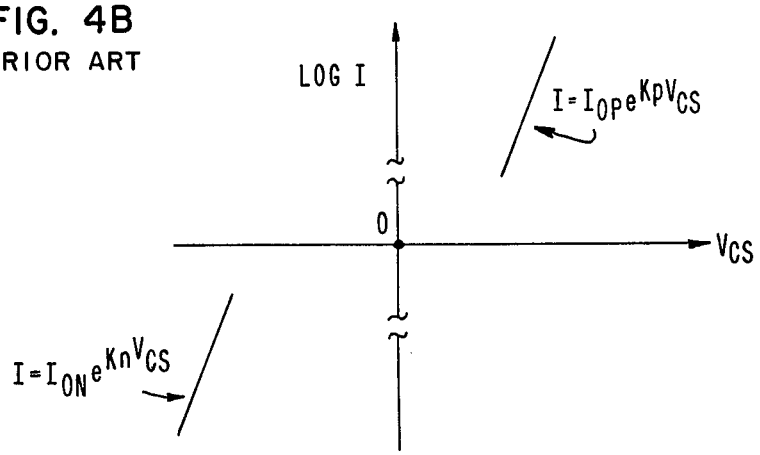
FIG. 4B illustrates the voltage that is driving the device on the abcissa and the log of the current on the ordinate.

FIGS. 4A and 4B show the principles of these devices. FIG. 4A illustrates the prior art DEIS stack. The top layer 16 is connected to a voltage supply 17. Layer 16 is polycrystaline silicon. Layer 18 is a silicon rich silicon dioxide layer that is chemically vapor deposited as described in the foregoing article. Layer 19 is a silicon dioxide insulator layer grown to the same thickness and parameters as that used in a memory cell product on the same chip. Layer 20 is the same as layer 18 and layer 21 is the same as layer 16.

The FET diodes in FIG. 3 designated with numeral 3 have their source and drain contacts protected from higher voltages by use of protect gate layers.

In typical capacitive FET technology, the breakdown voltage between the drain and the source will be about 12 volts for an enhancement device and about 14 volts in a depletion mode device with the gate to source voltage set at 0. The 12 and 14 volt levels are simply insufficient to program/erase most electrically alterable FET memory devices.

Figure 5A:
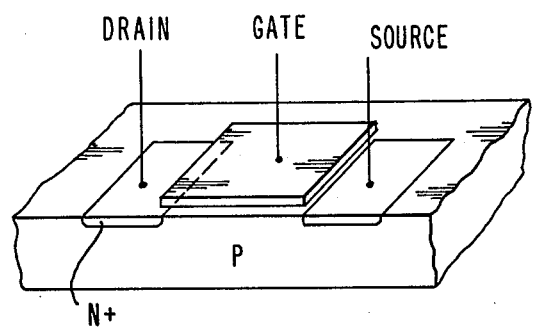
FIG. 5A illustrates a typical prior art FET. The oxide insulating layer has been removed.
Figure 5B:
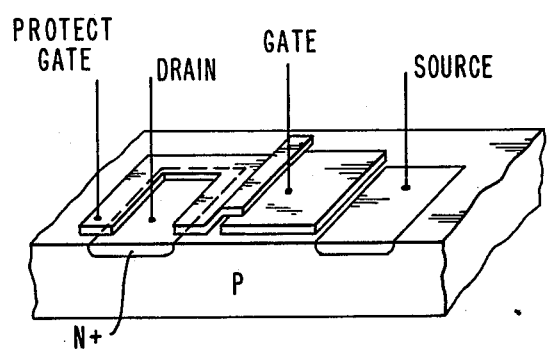
FIG. 5B illustrates a typical FET with the oxide layers removed for clarity which incorporates a protect gate around the boundaries of the drain diffusion in the substrate.

FIG. 5B illustrates a typical FET with the oxide layers removed for clarity which incorporates a protect gate around the boundaries of the drain diffusion in the substrate. This is a conductive layer that also partially overlies the control gate but is insulated therefrom by an oxide layer. A similar structure may be used between the control gate and around the terminations of the source diffusion. Typically, protection at the drain is sufficient.

Figure 5C:
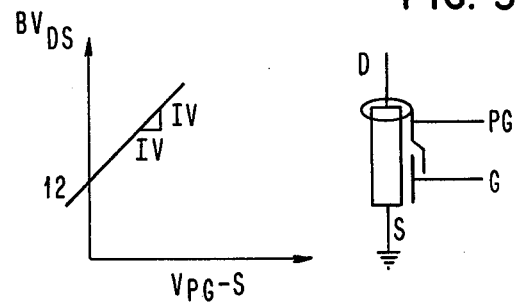
FIG. 5C shows an electrical schematic illustrating the protection gate as PG and shows how the breakdown voltage increases from approximately 12 volts to a higher level in the small accompanying voltage plot.

FIG. 5C shows an electrical schematic illustrating the protection gate as PG and shows how the breakdown voltage increases from approximately 12 volts to a higher level in the small accompanying voltage plot. In operation, a protection voltage is applied to the protect gate that prevents drain to source or drain to substrate breakdown in approximately linear fashion as shown. This technique allows the devices to be driven to voltages well above those at which normal breakdown occurs. Voltages in excess of 22 to 25 volts may be sustained in this manner without an unnecessary drain on the charge pump since the protect gate voltage is effectively only a capacitive load of small proportion.

INDUSTRIAL APPLICABILITY

The high voltage converter described in the preferred embodiment hereof offers unique features for electrically alterable on chip memory technology applications as will be appreciated by those of skill in the art. The converter shown provides a way of tracking the electron charge trapping tunneling characteristics for a specific chip on which the converter is built. This eliminates a wide design margin that would otherwise be necessary in order to accommodate for the entire process range. It also adjusts for the electron trapping and causes a voltage adjustment to occur with further usage that helps offset the negative effects of charge trapping in the memory devices.

Having thus described our invention with reference to a preferred embodiment, what we desire to protect by Letters Patent is:

1. A charge trapping corrected, on chip, high voltage power supply apparatus comprising:

a charge pump circuit having drive inputs connected to a low voltage power supply and having outputs supplying the pumped high voltage;

a feedback circuit connected to the high voltage outputs of said charge pump and including a series connected DEIS means exhibiting charge trapping which reduces the voltage fed back in proportion to the trapping occurring therein; and voltage control means connected in series to the charge pump drive inputs for decreasing the voltage applied thereto in proportion to the voltage from said DEIS means.

2. A method of operating an on chip, high voltage power supply apparatus comprising steps of:

monitoring the high voltage output in a feedback circuit containing a series connected DEIS means that exhibits charge trapping to the same degree that memory circuitry on said same chip exhibits charge trapping; and limiting the input supplied to the high voltage generating means in proportion to the amount by which the fed back voltage from the DEIS means exceeds a reference voltage.

3. A charge trapping corrected, on chip, high voltage power supply apparatus comprising:

a capacitive charge pump circuit having drive inputs connected to a low voltage power supply and having outputs supplying the pumped high voltage;

an output voltage monitoring and voltage regulator means comprising a feedback circuit connected to the high voltage outputs of said charge pump and including a series connected DEIS means exhibiting charge trapping which reduces the voltage fed back in proportion to the trapping occurring therein; and a fixed voltage drop developing circuit connected between said DEIS means and ground; and a reference voltage developing circuit connected between the low voltage power supply and ground; and a differential amplifier means connected to said fixed voltage drop of said feedback path and to said reference voltage; and voltage limiting means in series with the charge pump drive inputs and connected to and operated by the output of said differential amplifier to decrease the voltage applied to the inputs of said charge pump as the feedback voltage rises above said reference voltage.

* * * * *